United States Patent
Chiang et al.

(10) Patent No.: US 10,304,886 B2
(45) Date of Patent: May 28, 2019

(54) BACK-SIDE DEEP TRENCH ISOLATION (BDTI) STRUCTURE FOR PINNED PHOTODIODE IMAGE SENSOR

(71) Applicant: Taiwan Semiconductor Manufacturing Co., Ltd., Hsin-Chu (TW)

(72) Inventors: Yen-Ting Chiang, Tainan (TW); Dun-Nian Yaung, Taipei (TW); Hsiao-Hui Tseng, Tainan (TW); Jen-Cheng Liu, Hsin-Chu (TW); Yu-Jen Wang, Kaohsiung (TW); Chun-Yuan Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/795,681

(22) Filed: Oct. 27, 2017

(65) Prior Publication Data
US 2019/0096929 A1    Mar. 28, 2019

Related U.S. Application Data

(60) Provisional application No. 62/564,342, filed on Sep. 28, 2017.

(51) Int. Cl.
*H01L 27/146* (2006.01)

(52) U.S. Cl.
CPC .... *H01L 27/1463* (2013.01); *H01L 27/14643* (2013.01); *H01L 27/14689* (2013.01)

(58) Field of Classification Search
CPC .......... H01L 27/1463; H01L 27/14643; H01L 27/14689
See application file for complete search history.

(56) References Cited

U.S. PATENT DOCUMENTS

| 9,160,953 | B2 * | 10/2015 | Oishi | H04N 5/372 |
| 9,847,363 | B2 * | 12/2017 | Tsai | H01L 27/1463 |
| 9,887,235 | B2 * | 2/2018 | Cheng | H01L 27/14689 |
| 9,954,022 | B2 * | 4/2018 | Chen | H01L 27/1463 |

(Continued)

FOREIGN PATENT DOCUMENTS

DE   102016100013 A1 *  4/2017  ......... H01L 27/1464

*Primary Examiner* — Earl N Taylor
(74) *Attorney, Agent, or Firm* — Eschweiler & Potashnik, LLC

(57) ABSTRACT

The present disclosure relates to a CMOS image sensor having a photodiode surrounded by a back-side deep trench isolation (BDTI) structure, and an associated method of formation. In some embodiments, a plurality of pixel regions is disposed within a substrate and respectively comprising a photodiode. A back-side deep trench isolation (BDTI) structure is disposed between adjacent pixel regions, extending from a back-side of the substrate to a position within the substrate. The BDTI structure comprises a doped layer lining a sidewall surface of a deep trench and a dielectric fill layer filling a remaining space of the deep trench. By forming the disclosed BDTI structure that functions as a doped well and an isolation structure, the implantation processes from a front-side of the substrate is simplified, and thus the exposure resolution, the full well capacity of the photodiode, and the pinned voltage is improved.

20 Claims, 7 Drawing Sheets

(56) References Cited

U.S. PATENT DOCUMENTS

| | | | |
|---|---|---|---|
| 2007/0045684 A1* | 3/2007 | Lee | H01L 27/1463 |
| | | | 257/292 |
| 2010/0110239 A1* | 5/2010 | Ramappa | H01L 27/14603 |
| | | | 348/243 |
| 2011/0241152 A1* | 10/2011 | Hsiao | H01L 27/1463 |
| | | | 257/447 |
| 2013/0113061 A1* | 5/2013 | Lai | H01L 27/1463 |
| | | | 257/432 |
| 2014/0035087 A1* | 2/2014 | Liu | H01L 27/1463 |
| | | | 257/443 |
| 2014/0183606 A1* | 7/2014 | Kakehi | H01L 27/14689 |
| | | | 257/290 |
| 2015/0243694 A1* | 8/2015 | Ihara | H01L 27/14605 |
| | | | 257/443 |
| 2015/0349001 A1* | 12/2015 | Wang | H01L 27/1463 |
| | | | 257/443 |
| 2016/0043120 A1* | 2/2016 | Ahn | H01L 27/1463 |
| | | | 257/229 |
| 2016/0079288 A1* | 3/2016 | Choi | H01L 27/1463 |
| | | | 438/70 |
| 2017/0110494 A1* | 4/2017 | Tsai | H01L 27/1463 |
| 2017/0117309 A1* | 4/2017 | Chen | H01L 27/1463 |
| 2017/0170231 A1* | 6/2017 | Cheng | H01L 27/14689 |
| 2018/0122843 A1* | 5/2018 | Tsai | H01L 27/1463 |
| 2018/0204861 A1* | 7/2018 | Borthakur | H01L 27/1463 |

\* cited by examiner

BACK-SIDE DEEP TRENCH ISOLATION (BDTI) STRUCTURE FOR PINNED PHOTODIODE IMAGE SENSOR

REFERENCE TO RELATED APPLICATION

This Application claims priority to U.S. Provisional Application No. 62/564,342 filed on Sep. 28, 2017, the contents of which are hereby incorporated by reference in their entirety.

BACKGROUND

Digital cameras and optical imaging devices employ image sensors. Image sensors convert optical images to digital data that may be represented as digital images. An image sensor includes a pixel array (or grid) for detecting light and recording intensity (brightness) of the detected light. The pixel array responds to the light by accumulating a charge. The accumulated charge is then used (for example, by other circuitry) to provide a color and brightness signal for use in a suitable application, such as a digital camera. One type of image sensor is a backside illuminated (BSI) image sensor device. BSI image sensor devices are used for sensing a volume of light projected towards a back-side of a substrate (which is opposite to a front-side of the substrate where interconnect structures including multiple metal and dielectric layers are built thereon). BSI image sensor devices provide a reduced destructive interference, as compared to front-side illuminated (FSI) image sensor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
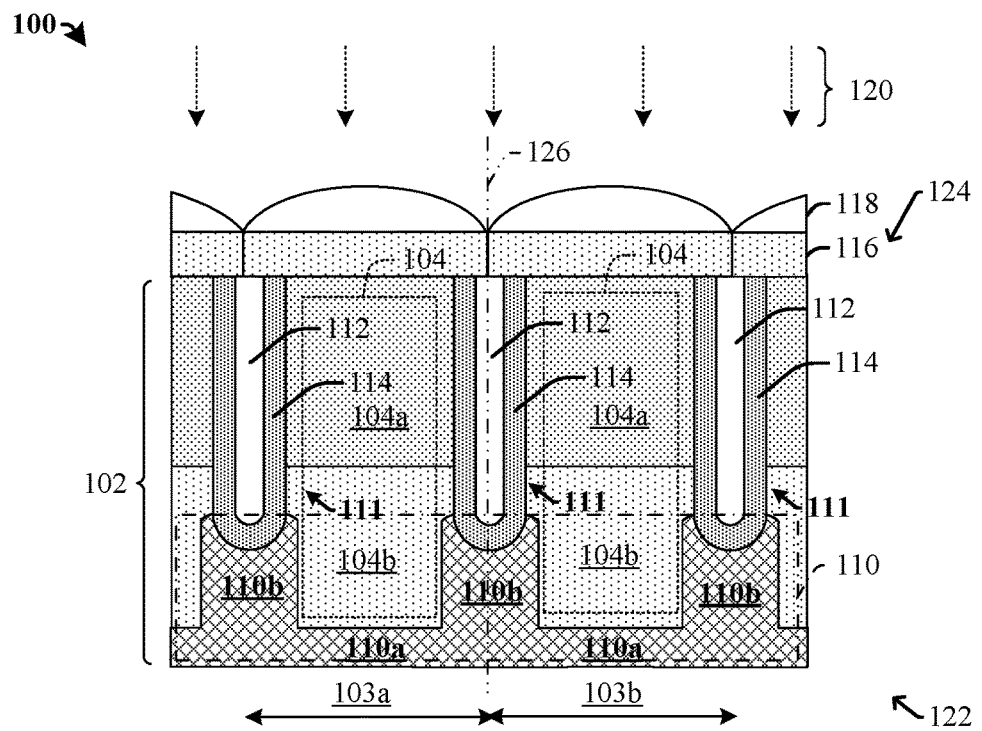
FIG. 1 illustrates a cross-sectional view of some embodiments of a CMOS (complementary metal-oxide-semiconductor) image sensor having a photodiode surrounded by a back-side deep trench isolation (BDTI) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration density, higher speeds, and better performance. Due to device scaling, pixels of the pixel array of an image sensor have smaller dimensions and are closer to one another. An improved electrical and optical isolation between neighboring pixels of the image sensor is needed in order to reduce blooming and crosstalk. Dielectric trenches and implantation wells can be fabricated as isolation structures to isolate image sensor pixels.

In addition, driven by low noise applications, pinned photodiode (PPD) CMOS image sensor have become the main image sensors technology for both commercial and scientific applications. The PPD is formed by a double p-n junction, where a surface p+ implant, also referred to as pinning-implant, is formed on a surface of the substrate. This double p-n junction structure not only reduces the dark current (by isolating the collection buried channel from the charges generated at the SiO2-Si interface), but also limits the maximum PPD channel potential, often referred to as pinning voltage, which corresponds to the full depletion condition. One kind of current image sensor fabrication processes includes a series of implantation processes to form the pinned-implant for PPD structure and implant wells as isolation walls. However, besides fabrication complexity, these implantation processes involves a thick photoresist layer which reduces exposure resolution. Also, a full well capacity of the photodiode is limited and a higher pinned voltage is formed by the implant profile, which negatively affect performance of the image sensor.

The present disclosure relates to a CMOS image sensor comprising a back-side deep trench isolation (BDTI) structure surrounding a photodiode, and an associated method of formation. In some embodiments, the CMOS image sensor has a pixel region disposed within a substrate. The pixel region has a photodiode configured to convert radiation into an electric signal. A back-side deep trench isolation (BDTI) structure disposed in the pixel region of the substrate, extending from a back-side of the substrate to a position within the substrate. The BDTI structure comprises a doped layer and a dielectric layer, the doped layer lining a sidewall surface of a deep trench and the dielectric layer filling a remaining space of the deep trench. The BDTI structure may be formed from a back-side of the substrate and functions as an isolation structure between neighboring pixels and also functions as a doped well for depletion. Thereby, with the disclosed BDTI structure functioned as a doped well, the implantation processes from a front-side of the substrate is simplified, and thus the exposure resolution, the full well capacity of the photodiode, and the pinned voltage is improved. With the disclosed BDTI structure functioned as a deep isolation structure, the blooming and crosstalk are reduced.

FIG. 1 illustrates a cross-sectional view 100 of some embodiments of a CMOS image sensor having a photodiode surrounded by a back-side deep trench isolation (BDTI) structure. The CMOS image sensor comprises a substrate 102 having a front-side 122 and a back-side 124. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 comprises a plurality of pixel regions that may be arranged within the substrate 102 in an array comprising rows and/or columns, such as pixel regions 103a, 103b shown in FIG. 1. The pixel regions 103a, 103b respectively comprises a photodiode 104 configured to convert incident radiation or incident light 120 (e.g., photons) into an electric signal. In some embodiments, the photodiode 104 comprises a first region 104a within the substrate 102 having a first doping type (e.g., p-type doping) and an adjoining second region 104b within the substrate 102 having a second doping type (e.g., n-type doping) that is different than the first doping type.

A back-side deep trench isolation (BDTI) structure 111 is disposed in the substrate 102, extending from the back-side 124 to a position within the substrate 102. The BDTI structure 111 is disposed between and isolate adjacent pixel regions 103a, 103b. In some embodiments, the BDTI structure 111 comprises a doped layer 114 with the first doping type (e.g., p-type doping) and a dielectric fill layer 112 (e.g., an oxide layer). The doped layer 114 lines a sidewall surface of a deep trench, and the dielectric fill layer 112 fills a remaining space of the deep trench.

In some embodiments, a doped isolation layer 110 is disposed in the substrate 102, extending from the front-side 122 to a position within the substrate 102. The doped isolation layer 110 may have the first doping type (e.g., p-type doping). The doped isolation layer 110 may comprise a lateral portion 110a and a vertical portion 110b extending deeper into the substrate. The lateral portion 110a extends along the front-side 122 of the substrate 102. The lateral portion 110a may contact a lateral surface of the photodiode 104 and functions as a pinned implant layer for the photodiode 104. The vertical portion 110b extends from the front-side 122 of the substrate 102 to a position within the substrate 102 between adjacent pixel regions 103a, 103b. The lateral portion 110a may be heavily doped (e.g. having a resistivity down in the range of milliOhm/cm) and have a doping concentration greater than the vertical portion 110b. In some embodiments, the vertical portion 110b is vertically aligned with the BDTI structure 111 (e.g. sharing a common center line 126). The vertical portion 110b may meet the BDTI structure 111 within the substrate 102. A bottom portion of the BDTI structure 111 may be disposed within a recessed top surface of the vertical portion 110b of the doped isolation layer 110. The BDTI structure 111 and the doped isolation layer 110 collectively function as isolations for the pixel regions 103a, 103b, such that crosstalk and blooming among the pixel regions 103a, 103b can be reduced. The BDTI structure 111 and the doped isolation layer 110 also collectively facilitate depletion of the photodiode 104 during the operation, such that full well capacity and pinned voltage is improved.

In some embodiments, a plurality of color filters 116 are arranged over the back-side 124 of the substrate 102. The plurality of color filters 116 are respectively configured to transmit specific wavelengths of incident radiation or incident light 120. For example, a first color filter (e.g., a red color filter) may transmit light having wavelengths within a first range, while a second color filter may transmit light having wavelengths within a second range different than the first range. In some embodiments, the plurality of color filters 116 may be arranged within a grid structure overlying the substrate 102. In some embodiments, the grid structure may comprise a stacked grid having a metal framework surrounded by a dielectric material. In some embodiments, layer of dielectric material and the stacked grid may have a same dielectric material (e.g., silicon-dioxide ($SiO_2$)).

A plurality of micro-lenses 118 are arranged over the plurality of color filters 116. Respective micro-lenses 118 are aligned laterally with the color filters 116 and overlie the pixel regions 103a, 103b. In some embodiments, the plurality of micro-lenses 118 have a substantially flat bottom surface abutting the plurality of color filters 116 and a curved upper surface. The curved upper surface is configured to focus the incident radiation or incident light 120 (e.g., light towards the underlying pixel regions 103a, 103b. During operation of the CMOS image sensor, the incident radiation or incident light 120 is focused by the micro-lens 118 to the underlying pixel regions 103a, 103b. When incident radiation or incident light of sufficient energy strikes the photodiode 104, it generates an electron-hole pair that produces a photocurrent. Notably, though the micro-lenses 118 is shown as fixing onto the image sensor in FIG. 1, it is appreciated that the image sensor may not include micro-lens, and the micro-lens may be attached to the image sensor later in a separate manufacture activity.

Figure 2:
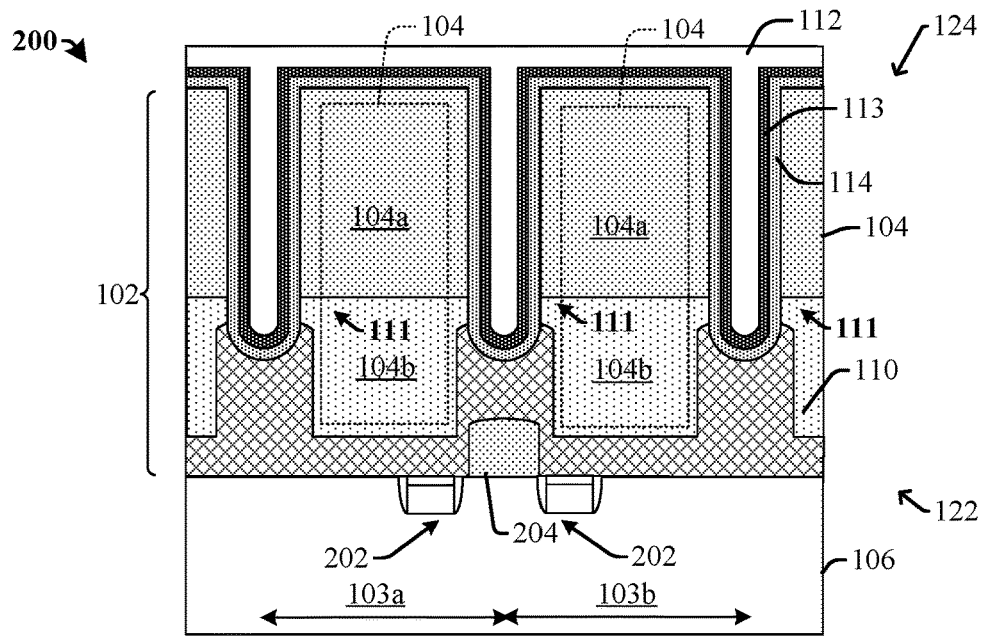
FIG. 2 illustrates a cross-sectional view of some additional embodiments of a CMOS image sensor comprising a photodiode surrounded by a back-side deep trench isolation (BDTI) structure.

FIG. 2 illustrates a cross-sectional view of some additional embodiments of a CMOS image sensor comprising the photodiode 104 surrounded by the BDTI structure 111. Besides similar features shown and described above for FIG. 1, in some embodiments, as shown in FIG. 2, the BDTI structure 111 further comprises a high-k dielectric liner 113 disposed between the doped layer 114 and the dielectric fill layer 112. The high-k dielectric liner 113 may function as a passivation layer and separate the doped layer 114 from dielectric fill layer 112. The high-k dielectric liner 113 may comprise aluminum oxide (AlO), hafnium oxide (HfO), hafnium silicon oxide (HfSiO), hafnium aluminum oxide (HfAlO), or hafnium tantalum oxide (HfTaO), for example.

In some embodiments, different from what is shown in FIG. 1 where the doped layer 114 and the dielectric fill layer 112 have top surfaces coplanar with a lateral surface of the back-side 124 of the substrate 102, in FIG. 2, the doped layer 114, the high-k dielectric liner 113 and the dielectric fill layer 112 may extend upwardly from the deep trench over the back-side 124 of the substrate 102 and laterally disposed along the back-side of the substrate 102. The doped layer 114 and the high-k dielectric liner 113 may be conformal layers. The image sensor shown in FIG. 2 may be an intermediate structure, and the doped layer 114, the high-k dielectric liner 113 and the dielectric fill layer 112 may or may not subject to a planarization process such that top surfaces of the layers could be altered.

In some embodiments, a floating diffusion well 204 is disposed between the adjacent pixel regions 103a, 103b from the front-side 122 of the substrate 102 to a position within the substrate 102. A transfer gate 202 is arranged on the front-side 122 of the substrate 102 at a position laterally between the photodiode 104 and the floating diffusion well 204. During the operation, the transfer gate 202 controls charge transfer from the photodiode 104 to the floating diffusion well 204. If the charge level is sufficiently high within the floating diffusion well 204, a source follower transistor (not shown) is activated and charges are selectively output according to operation of a row select transistor (not shown) used for addressing. A reset transistor (not shown) can be used to reset the photodiode 104 between exposure periods.

Figure 3:
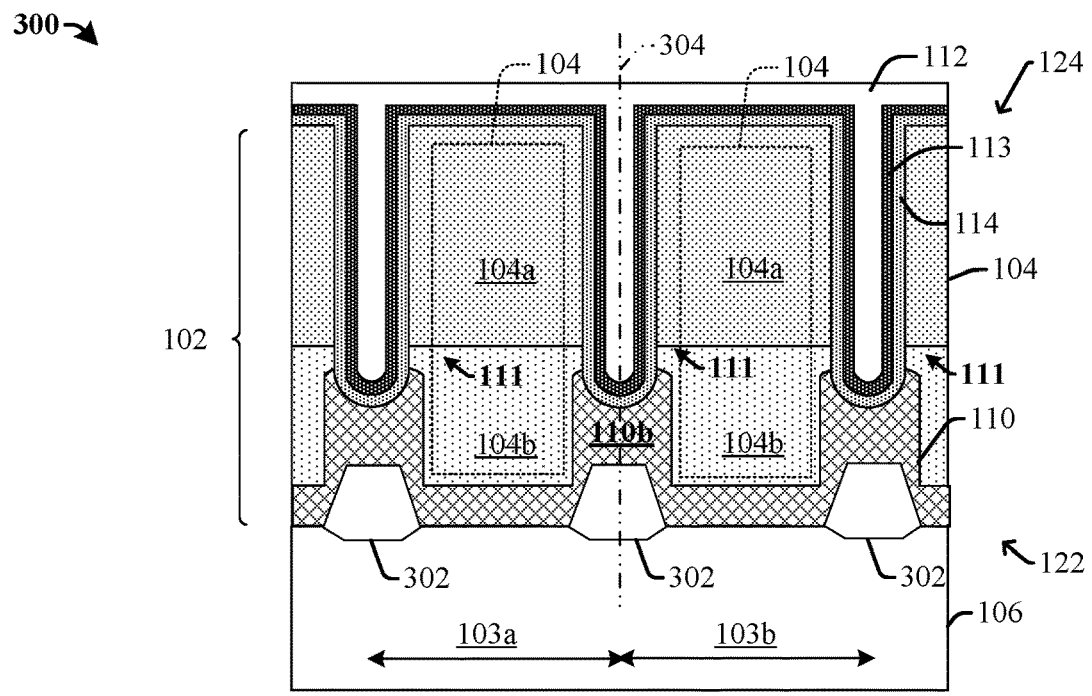
FIG. 3 illustrates a cross-sectional view of some additional embodiments of a CMOS image sensor comprising a photodiode surrounded by a back-side deep trench isolation (BDTI) structure.

FIG. 3 illustrates a cross-sectional view of some additional embodiments of a CMOS image sensor comprising the photodiode 104 surrounded by the BDTI structure 111. Besides similar features shown and described above for FIG. 1 and FIG. 2, in some embodiments, as shown in FIG. 3, a shallow trench isolation (STI) structure 302 is disposed between the adjacent pixel regions 103a, 103b from the front-side 122 of the substrate 102 to a position within the substrate 102. The STI structure 302 and the BDTI structure 111 are vertically aligned (e.g. sharing a common center line 304, which may or may or share a center line with the vertical portion 110b of the doped isolation layer 110). In some embodiments, the vertical portion 110b of the doped isolation layer 110 extends from the front-side 122 of the substrate 102 to a position within the substrate 102 and surrounding the STI structure 302. The vertical portion 110b of the doped isolation layer 110 may separate the STI structure 302 from the BDTI structure 111. Thus, the BDTI structure 111, the doped isolation layer 110, and the STI structure 302 collectively function as isolations for the pixel regions 103a, 103b, such that crosstalk and blooming among the pixel regions 103a, 103b can be reduced. The BDTI structure 111 and the doped isolation layer 110 also collectively facilitate depletion of the photodiode 104 during the operation, such that full well capacity and pinned voltage is improved.

Figure 4:
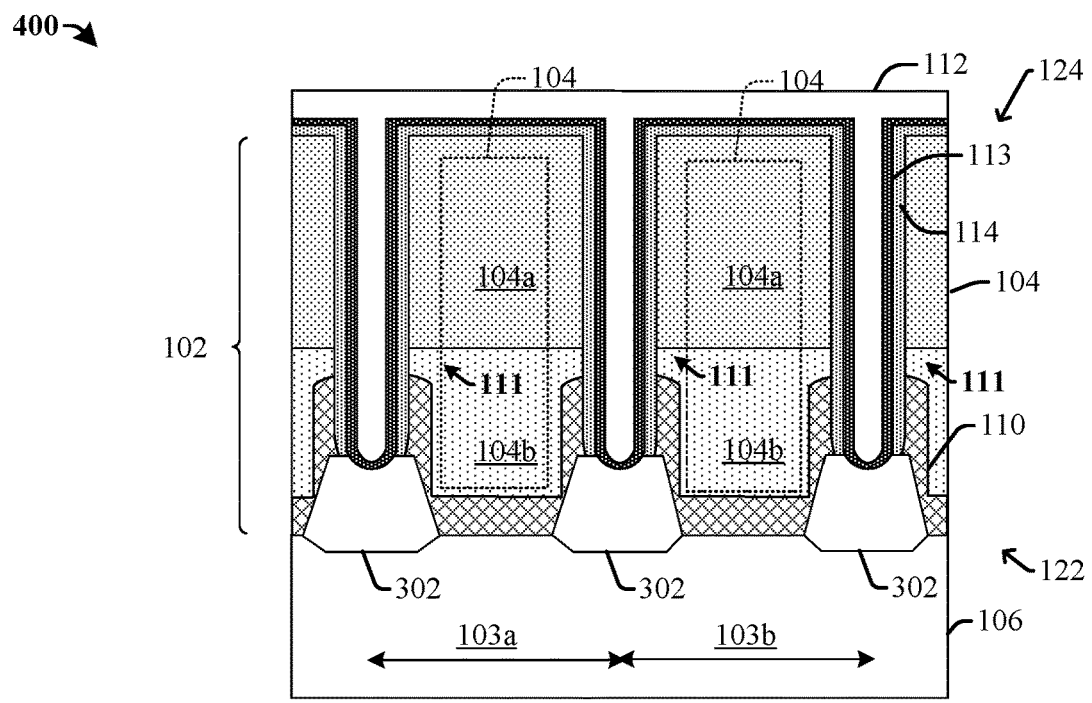
FIG. 4 illustrates a cross-sectional view of some additional embodiments of a CMOS image sensor comprising a photodiode surrounded by a back-side deep trench isolation (BDTI) structure.

FIG. 4 illustrates a cross-sectional view of some additional embodiments of a CMOS image sensor comprising the photodiode 104 surrounded by the BDTI structure 111. As an alternative embodiment to FIG. 3 where the doped isolation layer 110 separates the STI structure 302 from the BDTI structure 111, as shown in FIG. 4, the BDTI structure 111 extends deeper into the substrate 102 and meet the STI structure 302. In some embodiments, the doped layer 114 of the BDTI structure 111 lands on a planar or recessed top surface of the STI structure 302, while the high-k dielectric liner 113 and/or the dielectric fill layer 112 of the BDTI structure 111 extends further down to a concave recess of the STI structure 302.

Figure 5A:
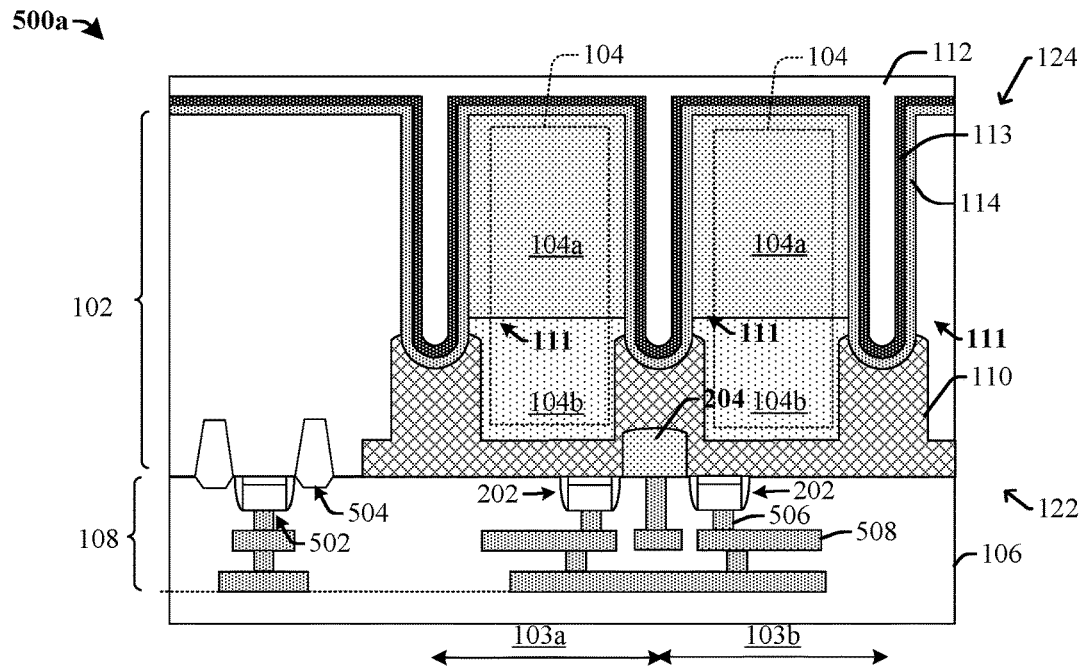
FIG. 5A illustrates a cross-sectional view of some embodiments of an integrated chip comprising an image sensor having a photodiode surrounded by a back-side deep trench isolation (BDTI) structure.

FIG. 5A illustrates a cross-sectional view of some embodiments of an integrated chip comprising an image sensor having the photodiode 104 surrounded by the BDTI structure 111. Besides similar features shown and described above, in some embodiments, as shown in FIG. 5A, a back-end-of-the-line (BEOL) metallization stack 108 is arranged on the front-side 122 of the substrate 102. The BEOL metallization stack 108 comprises a plurality of metal interconnect layers arranged within one or more inter-level dielectric (ILD) layers 106. The ILD layers 106 may comprise one or more of a low-k dielectric layer (i.e., a dielectric with a dielectric constant less than about 3.9), an ultra low-k dielectric layer, or an oxide (e.g., silicon oxide). A logic gate device 502 may be disposed within the same integrated chip of the image sensor and isolated by a logic STI structure 504. Conductive contacts 506 are arranged within the ILD layers 106. The conductive contacts 506 extend from the transfer gate 202 and the floating diffusion well 204 to one or more metal wire layers 508. In various embodiments, the conductive contacts 506 may comprise a conductive metal such as copper or tungsten, for example.

Figure 5B:
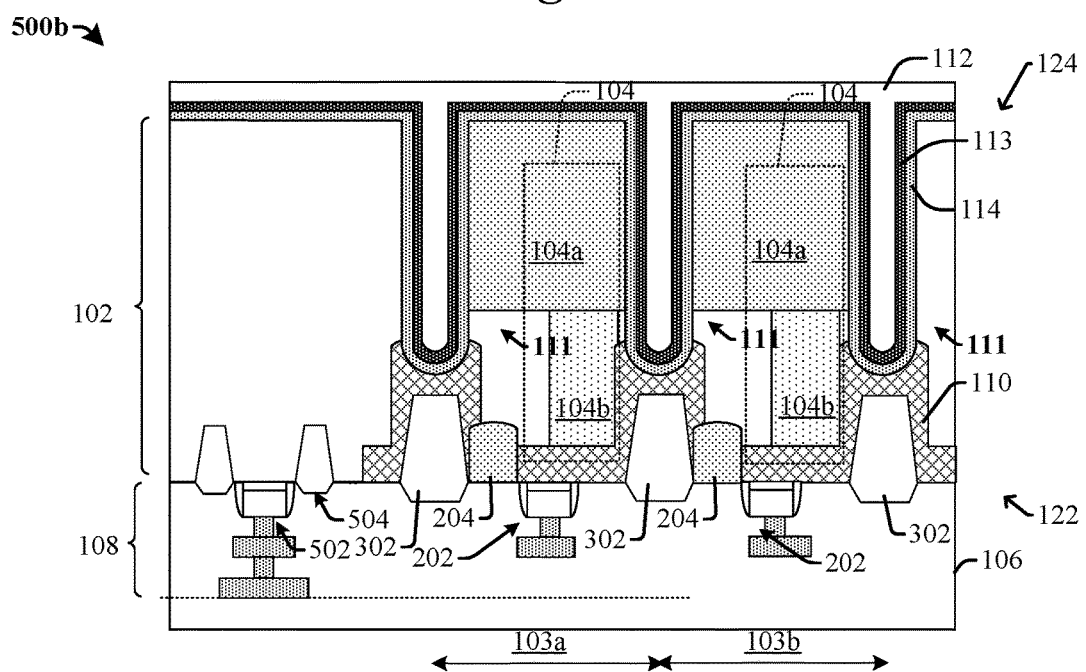
FIG. 5B illustrates a cross-sectional view of some additional embodiments of an integrated chip comprising an image sensor having a photodiode surrounded by a back-side deep trench isolation (BDTI) structure.

FIG. 5B illustrates a cross-sectional view of some additional embodiments of an integrated chip comprising an image sensor having the photodiode 104 surrounded by the BDTI structure 111. As an alternative of the embodiments disclosed above, the image sensor may have the second region 104b of the photodiode 104 with a lateral dimension smaller than that of the first region 104a. The floating diffusion well 204 is disposed between the STI structures 302 at the other side of the transfer gate 202 opposite to the photodiode 104. The logic STI structure 504 may have same or different dimensions of the STI structure 302.

FIGS. 6-11 illustrate some embodiments of cross-sectional views showing a method of forming a CMOS image sensor having a photodiode surrounded by a back-side deep trench isolation (BDTI) structure.

Figure 6:
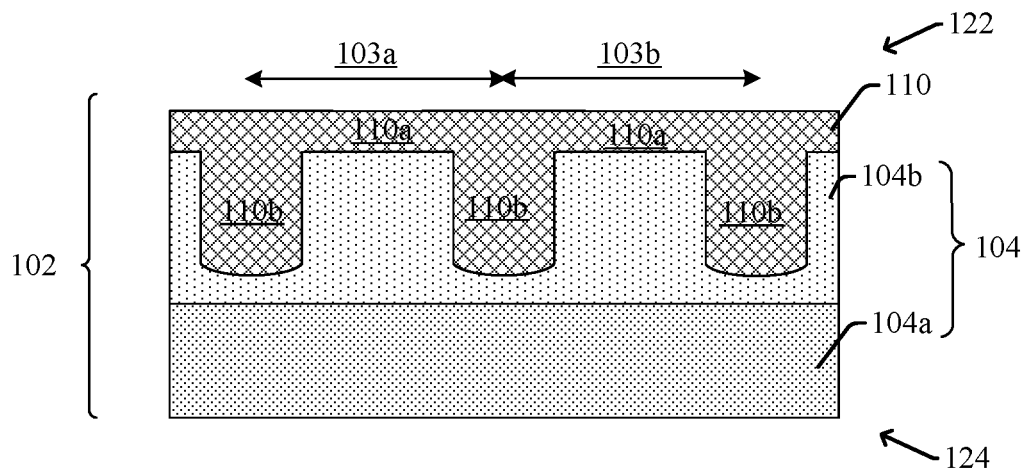
FIGS. 6-11 illustrate some embodiments of cross-sectional views showing a method of forming a CMOS image sensor having a photodiode surrounded by a back-side deep trench isolation (BDTI) structure.

As shown in cross-sectional view 600 of FIG. 6, dopant species are implanted into a substrate 102 to form doped region including a photodiode 104 and a doped isolation layer 110 within a front-side 122 of the substrate 102. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 may be prepared including a first region 104a of the photodiode to be formed with a first doping type (e.g. p-type). Then a blanket implant or a grading epitaxial growth process may be performed to form a second region 104b of the photodiode to be formed with a first doping type (e.g. p-type). A dopant species is then implanted into the substrate 102 to form a doped isolation layer 110. In some embodiments, the dopant species may comprise the first doping type (e.g. a p-type dopant such as boron) that is implanted into the front-side 122 of the substrate 102. In other embodiments, the dopant species may comprise an n-type dopant (e.g., phosphorous). In some embodiments, the dopant species may be implanted as a blanket implantation (i.e., an unmasked implantation) to form a lateral portion 110a extending into a first depth of the substrate 102 from the front-side 122 followed by a selective implantation (i.e., a masked implantation) to form a vertical portion 110b including a plurality of columns extending into a second depth of the substrate 102 that is deeper than the first depth. The lateral portion 110a may have a greater doping concentration than the vertical portion 110b.

Figure 7:
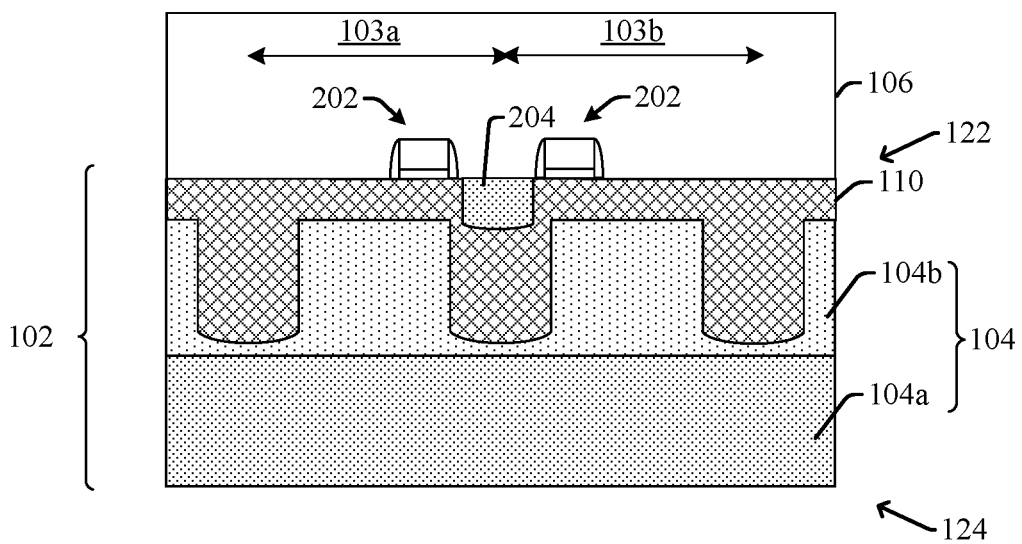

As shown in cross-sectional view 700 of FIG. 7, a transfer gate 202 is formed over a front-side 122 of the substrate 102. The transfer gate 202 may be formed by depositing a gate dielectric film and a gate electrode film over the substrate 102. The gate dielectric film and the gate electrode film are subsequently patterned to form a gate dielectric layer and a gate electrode. Sidewall spacers may be formed on the outer sidewalls of the gate electrode. In some embodiments, the sidewall spacers may be formed by depositing nitride onto the front-side 122 of the substrate 102 and selectively etching the nitride to form the sidewall spacers. Implantation processes are performed within the front-side 122 of the substrate 102 to form a floating diffusion well 204 along one side of the transfer gate 202 or opposing sides of a pair of the transfer gates 202 as shown in FIG. 7. In some embodiments, the substrate 102 may be selectively implanted according to a patterned masking layer (not shown) comprising photoresist.

Figure 10:
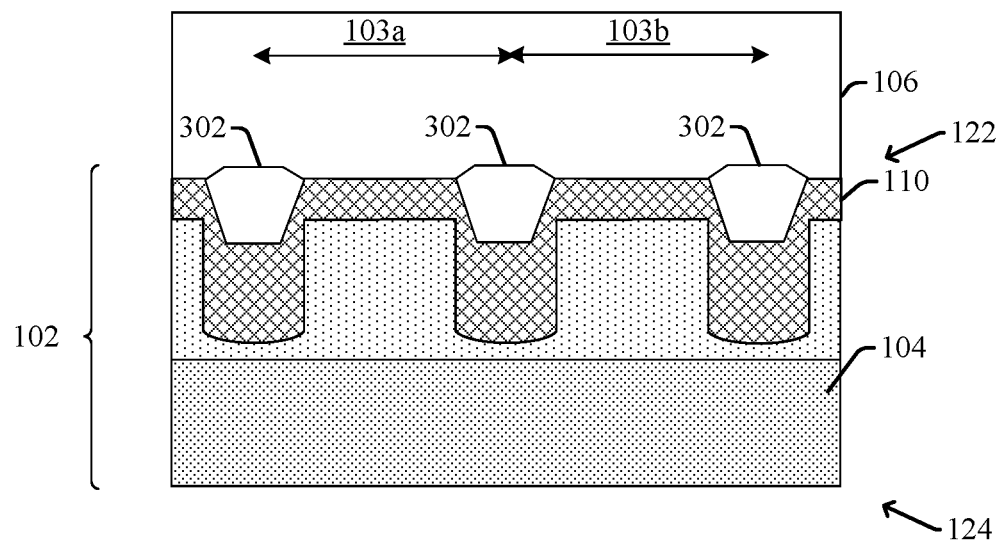

In some embodiments, as shown in cross-sectional view 1000 of FIG. 10, one or more isolation structures 302 (e.g., shallow trench isolation regions) may be formed within the front-side 122 of the substrate 102 on opposing sides of a pixel region 103a, 103b. The one or more isolation structures 302 may be formed by selectively etching the front-side 122 of the substrate 102 to form shallow-trenches and subsequently forming an oxide within the shallow-trenches. The one or more isolation structures 302 may be formed prior to or after formation of the transfer gate 202, and/or the floating diffusion well 204.

Though not shown in FIG. 6 or FIG. 10, a BEOL metallization stack comprising a plurality of metal interconnect layers arranged within an ILD layer (e.g. referring to FIG. 5A or 5B for the BEOL metallization stack 108 and the ILD layer 106) can be formed over the front-side 122 of the substrate 102. In some embodiments, the BEOL metallization stack may be formed by forming the ILD layer, which comprises one or more layers of ILD material, over the front-side 122 of the substrate 102. The ILD layer is subsequently etched to form via holes and/or metal trenches. The via holes and/or metal trenches are then filled with a conductive material to form the plurality of metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example. The ILD layer can be then bonded to a handle substrate (not shown). In some embodiments, the bonding process may use an intermediate bonding oxide layer arranged between the ILD layer and the handle substrate. In some embodiments, the bonding process may comprise a fusion bonding process.

Figure 8:
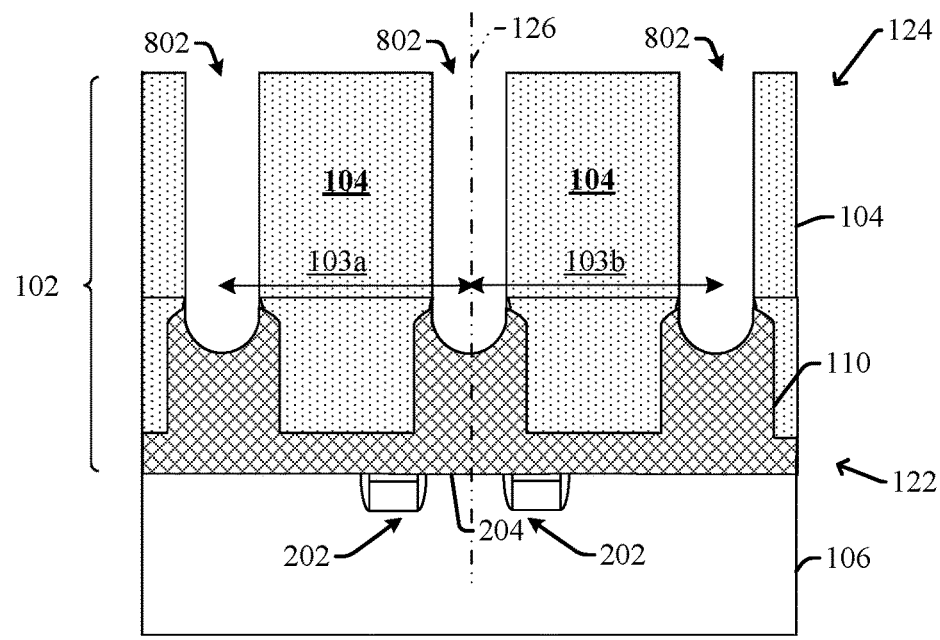

As shown in cross-sectional view 800 of FIG. 8, the substrate 102 is flipped over for further processing on a back-side 124 that is opposite to the front-side 122. The substrate 102 is selectively etched to form deep trenches 802 within the back-side 124 of the substrate 102. In some embodiments, the substrate 102 may be etched by forming a masking layer onto the back-side 124 of the substrate 102. The substrate 102 is then exposed to an etchant in regions not covered by the masking layer. The etchant etches the substrate 102 to form deep trenches 802 extending to the substrate 102. In various embodiments, the masking layer may comprise photoresist or a nitride (e.g., SiN) patterned using a photolithography process. In various embodiments, the etchant may comprise a dry etchant have an etching chemistry comprising a fluorine species (e.g., $CF_4$, $CHF_3$, $C_4F_8$, etc.) or a wet etchant (e.g., hydrofluoric acid (HF) or Tetramethylammonium hydroxide (TMAH)). The deep trenches 802 extend through the doped isolation layer 110 to a position within the substrate 102 and laterally separates the photodiode 104. The substrate 102 may be thinned to reduce a thickness of the substrate 102 before forming the deep trenches and allow for radiation to pass through the back-side 124 of the substrate 102 to the photodiode 104. In some embodiments, the substrate 102 may be thinned by etching the back-side 124 of the semiconductor substrate. In other embodiments, the substrate 102 may be thinned by mechanical grinding the back-side 124 of the semiconductor substrate.

Figure 9:
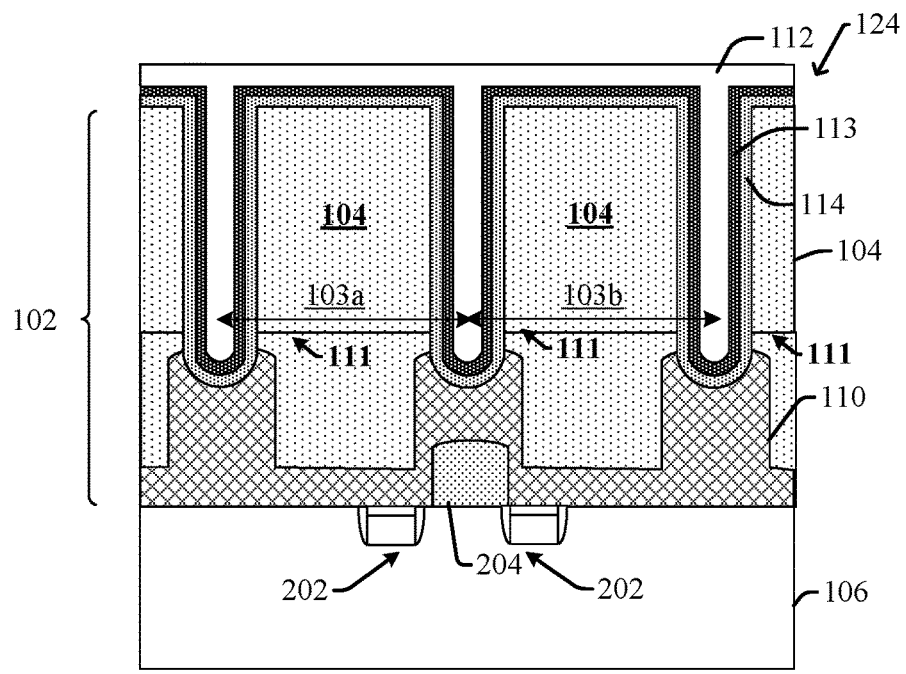
Figure 11:
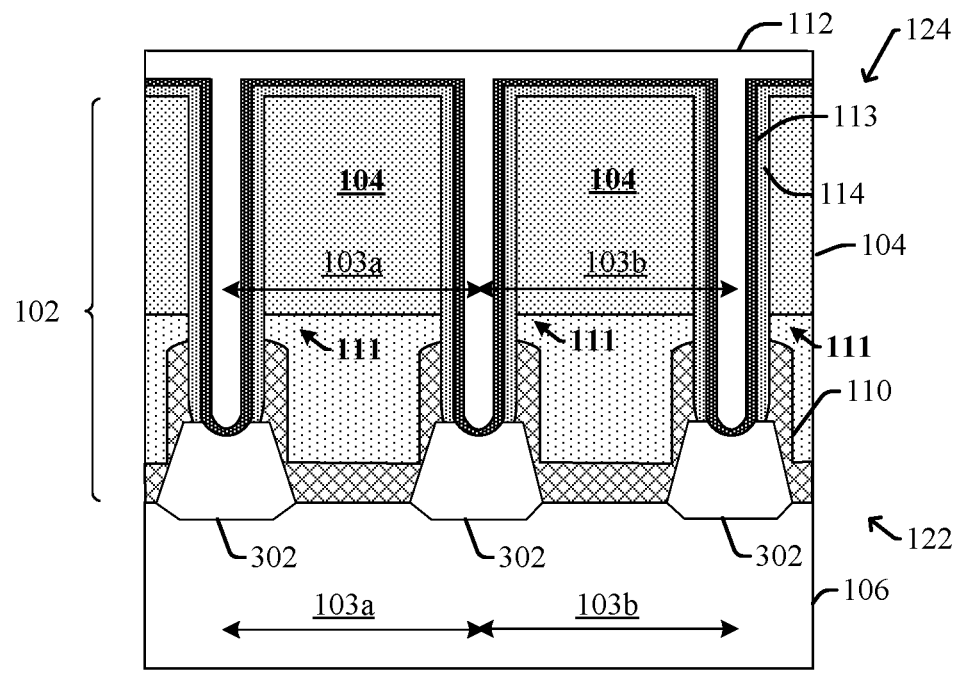

As shown in cross-sectional view 900 of FIG. 9 or cross-sectional view 1100 of FIG. 11, a self-aligned doped layer 114 is formed along sidewalls of the deep trenches 802. The doped layer 114 may be formed by an implantation process, a plasma doping process, an epitaxial growth process, an atomic layer deposition process, or other suitable techniques. The deep trenches 802 are then filled with dielectric material. In some embodiments, a high-k dielectric liner 113 is formed within the deep trenches 802 onto the doped layer 114. The high-k dielectric liner 113 may be formed by deposition techniques and may comprise aluminum oxide (AlO), hafnium oxide (HfO), tantalum oxide (TaO) or other dielectric materials having a dielectric constant greater than that of silicon oxide. The doped layer 114 and the high-k dielectric liner 113 line sidewalls and bottom surfaces of the deep trenches 802. In some embodiments, the doped layer 114 and the high-k dielectric liner 113 may extend over the back-side 124 of the substrate 102 between the deep trenches 802. A dielectric fill layer 112 is formed to fill a remainder of the deep trenches 802. In some embodiments, a planarization process is performed after forming the dielectric fill layer 112 to form a planar surface that extends along an upper surface of the high-k dielectric liner 113 and the dielectric fill layer 112. In some embodiments, the high-k dielectric liner 113 and the dielectric fill layer 112 may be deposited using a physical vapor deposition technique. As a result, the BDTI structure 111 is formed in the substrate 102, extending from the back-side 124 to a position within the substrate 102. The BDTI structure 111 is formed between and isolate adjacent pixel regions 103a, 103b.

Though not shown in the figure, a plurality of color filters (e.g. referring to the color filters 116 shown in FIG. 1) can be subsequently formed over the back-side 124 of the substrate 102. In some embodiments, the plurality of color filters may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. A plurality of micro-lenses (e.g. referring to the micro-lenses 118 shown in FIG. 1) may be formed over the plurality of color filters. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses are then formed by selectively etching the micro-lens material according to the micro-lens template.

Figure 12:
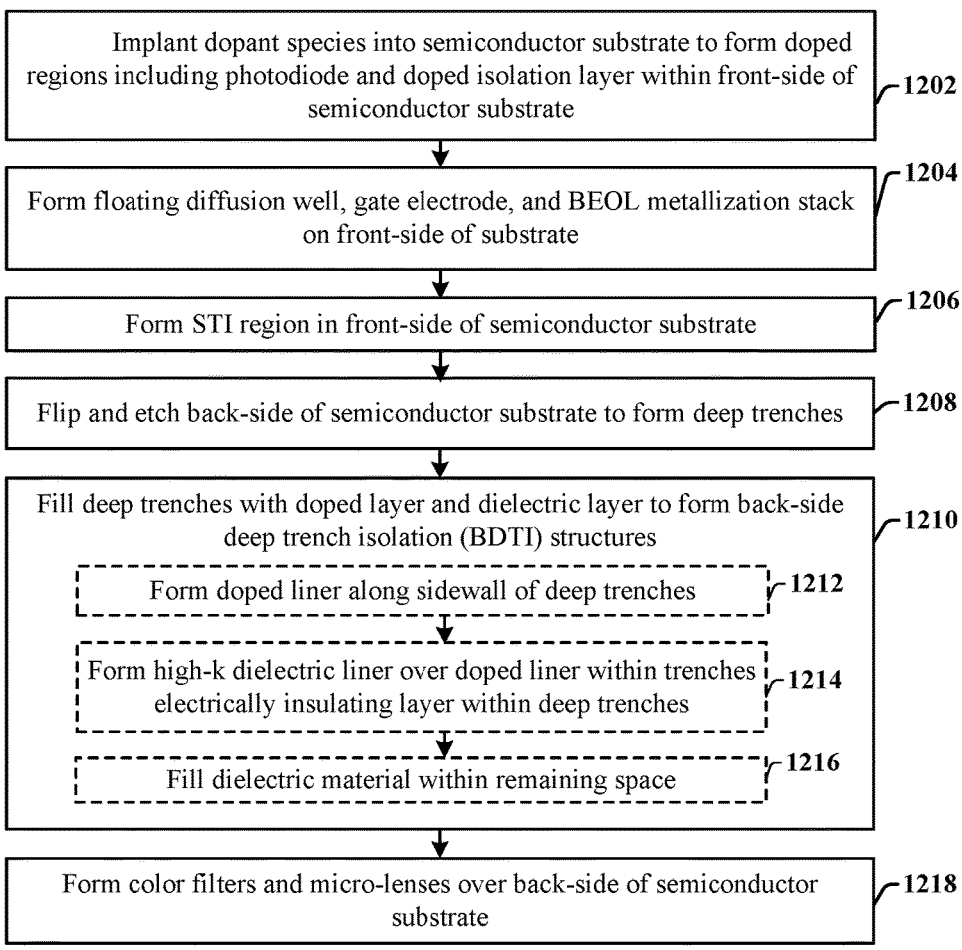
FIG. 12 illustrates a flow diagram of some embodiments of a method of forming a CMOS image sensor having a photodiode surrounded by a back-side deep trench isolation (BDTI) structure.

FIG. 12 illustrates a flow diagram of some embodiments of a method 1200 of forming a CMOS image sensor having a photodiode surrounded by a back-side deep trench isolation (BDTI) structure.

While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1202, a photodiode and a doped isolation layer are formed within the front-side of the substrate. In some embodiments, some part of the photodiode and/or the doped isolation layer may be formed by implanting dopant species into the front-side of the substrate. The doped isolation layer may be implanted as a blanket implantation to form a lateral portion followed by a selective implantation to form a vertical portion including a plurality of columns extending further into the substrate than the lateral portion. The lateral portion may have a greater doping concentration than the vertical portion. FIG. 6 illustrates a cross-sectional view corresponding to some embodiments corresponding to act 1202.

At 1204, a floating diffusion well and a transfer gate are formed within the front-side of the substrate. A BEOL metallization stack is formed over the transfer transistor on the front-side of the substrate. FIG. 7 illustrates a cross-sectional view corresponding to some embodiments corresponding to act 1204.

At 1206, a shallow trench isolation region may be formed within the front-side of the substrate by selectively etching the substrate to form shallow-trenches and subsequently forming a dielectric (e.g. an oxide) within the shallow-trenches. The one or more isolation structures may be formed prior to or after formation of the transfer gate, and/or the floating diffusion well. FIG. 10 illustrates a cross-sectional view corresponding to some embodiments corresponding to act 1206.

At 1208, the substrate is flipped over for further processing. A back-side of the substrate is selectively etched to form deep trenches extending into the substrate. The deep trenches may have a center line aligned with that of the vertical portion of the doped isolation layer and/or the shallow trench isolation region. FIG. 8 illustrates a cross-sectional view corresponding to some embodiments corresponding to act 1208.

At 1210, the deep trenches are filled to form back-side deep trench isolation (BDTI) structures separated from the photodiode by the doped isolation layer. FIG. 9 illustrates a cross-sectional view corresponding to some embodiments corresponding to act 1210. At 1212, a doped layer is formed along sidewalls of the deep trenches. At 1214, a high-k dielectric liner is formed within the deep trenches onto the doped layer. At 1216, a dielectric fill layer is formed to fill a remainder of the deep trenches.

At 1218, color filters and micro-lenses are formed over the back-side of the semiconductor substrate.

Therefore, the present disclosure relates to a CMOS image sensor having a photodiode surrounded by a back-side deep trench isolation (BDTI) structure, and an associated method of formation. The BDTI structure comprises a doped layer doped layer lining a sidewall surface of a deep trench and a dielectric layer filling a remaining space of the deep trench. By forming the disclosed BDTI structure that functions as a doped well and an isolation structure, the implantation processes from a front-side of the substrate is simplified, and thus the exposure resolution, the full well capacity of the photodiode, and the pinned voltage is improved, and the blooming and crosstalk are reduced.

In some embodiments, the present disclosure relates to a CMOS image sensor. The image sensor comprises a substrate having a front-side and a back-side opposite to the front-side. A plurality of pixel regions is disposed within the substrate and respectively comprising a photodiode configured to convert radiation that enters the substrate from the back-side into an electrical signal. A back-side deep trench isolation (BDTI) structure is disposed between adjacent pixel regions, extending from the back-side of the substrate to a position within the substrate. The BDTI structure comprises a doped layer with a first doping type and a dielectric fill layer, the doped layer lining a sidewall surface of a deep trench and the dielectric fill layer filling a remaining space of the deep trench.

In some alternative embodiments, the present disclosure relates to a CMOS image sensor. The image sensor comprises a substrate having a front-side and a back-side opposite to the front-side. A photodiode is arranged within the substrate. A back-side deep trench isolation (BDTI) structure extends from the back-side of the substrate to positions within the substrate on opposing sides of the photodiode. A back-end-of-the-line (BEOL) metallization stack arranged on the front-side of the substrate and comprising a plurality of metal interconnect layers arranged within an inter-level dielectric layer. The BDTI structure comprises a doped layer with a first doping type and a dielectric fill layer, the doped layer lining a sidewall surface of a deep trench and the dielectric fill layer filling a remaining space of the deep trench. a plurality of metal interconnect layers arranged within an inter-level dielectric layer.

In yet other embodiments, the present disclosure relates to method of forming an image sensor. The method comprises forming doping layers corresponding to photodiodes of a plurality of pixel regions from a front-side of a substrate. The method further comprises forming a doped isolation layer from the front-side of the substrate by implanting a dopant species into the substrate through a plurality of implanting processes, the doped isolation layer comprising a vertical portion between adjacent pixel regions. The method further comprises flipping over the substrate and etching from a back-side of the substrate to form a deep trench between adjacent pixel regions and extending into the substrate, wherein the back-side of the substrate opposes the front-side of the substrate. The method further comprises filling the deep trench with a doped layer and a dielectric fill layer a dielectric layer to form a back-side deep trench isolation (BDTI) structure that are disposed between the adjacent pixel regions and separate photodiodes of the adjacent pixel regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A CMOS image sensor, comprising:
a substrate having a front-side and a back-side opposite to the front-side;
a plurality of pixel regions disposed within the substrate and respectively comprising a photodiode configured to convert radiation that enters the substrate from the back-side into an electrical signal; and
a back-side deep trench isolation (BDTI) structure disposed within a deep trench between adjacent pixel regions, extending from the back-side of the substrate to a position within the substrate;
wherein the BDTI structure comprises a doped layer with a first doping type and a dielectric fill layer, the doped layer lining a sidewall surface of the deep trench and the dielectric fill layer filling a remaining space of the deep trench;
wherein the doped layer and the dielectric fill layer of the BDTI structure extend upwardly from the deep trench and laterally disposed along the back-side of the substrate.

2. The CMOS image sensor of claim 1, further comprising:
a doped isolation layer with the first doping type and comprising a lateral portion and a vertical portion in direct contact with one another, the lateral portion extending along the front-side of the substrate and the vertical portion extending between the adjacent pixel regions from the front-side of the substrate to a position within the substrate.

3. The CMOS image sensor of claim 2,
wherein the photodiode comprises a first region with the first doping type and a second region with a second doping type that is different than the first doping type; and
wherein the opposing sides of the first region contact the second region and the doped isolation layer.

4. The CMOS image sensor of claim 2, wherein the doped isolation layer and the BDTI structure meet within the substrate.

5. The CMOS image sensor of claim 2, wherein a bottom portion of the BDTI structure is disposed within a recessed top surface of the vertical portion of the doped isolation layer.

6. The CMOS image sensor of claim 1, the BDTI structure further comprising a high-k dielectric liner disposed between the doped layer and the dielectric fill layer.

7. The CMOS image sensor of claim 1, further comprising:
a floating diffusion well disposed between the adjacent pixel regions from the front-side of the substrate to a position within the substrate; and
a transfer gate arranged on the front-side of the substrate at a position laterally between the photodiode and the floating diffusion well.

8. The CMOS image sensor of claim 1, further comprising:
a shallow trench isolation (STI) structure disposed between the adjacent pixel regions from the front-side of the substrate to a position within the substrate;
wherein the STI structure and the BDTI structure are vertically aligned.

9. The CMOS image sensor of claim 8, further comprising:
a doped isolation layer with the first doping type extending from the front-side of the substrate to a position within the substrate.

10. The CMOS image sensor of claim 9, wherein the doped isolation layer separates the STI structure from the BDTI structure.

11. The CMOS image sensor of claim 8, wherein the doped layer of the BDTI structure lands on a planar top surface of the STI structure, while the dielectric fill layer of the BDTI structure extends further down to a concave recess of the STI structure.

12. The CMOS image sensor of claim 1, further comprising:
a back-end-of-the-line (BEOL) metallization stack arranged on the front-side of the substrate and comprising a plurality of metal interconnect layers arranged within one or more inter-level dielectric layers.

13. A CMOS image sensor, comprising:
a substrate having a front-side and a back-side opposite to the front-side;
a photodiode arranged within the substrate;
a back-side deep trench isolation (BDTI) structure extending from the back-side of the substrate to positions within the substrate on opposing sides of the photodiode; and
a doped isolation layer with a first doping type and comprising a lateral portion and a vertical portion in direct contact with one another, the lateral portion extending along the front-side of the substrate overlying the photodiodes of the pixel regions;
wherein the BDTI structure comprises a doped layer with the first doping type and a dielectric fill layer, the doped layer lining a sidewall surface of a deep trench and the dielectric fill layer filling a remaining space of the deep trench.

14. The CMOS image sensor of claim 13, wherein the BDTI structure laterally abuts sidewalls of the photodiode.

15. The CMOS image sensor of claim 13,
wherein the vertical portion of the doped isolation layer meets the BDTI structure within the substrate.

16. The CMOS image sensor of claim 15, further comprising:
a shallow trench isolation (STI) structure extending from the front-side of the substrate to a position within the doped isolation layer;
wherein the STI structure and the BDTI structure are vertically aligned.

17. The CMOS image sensor of claim 13, the BDTI structure further comprising:
a high-k dielectric liner disposed between the doped layer and the dielectric fill layer.

18. The CMOS image sensor of claim 13, wherein a bottom portion of the BDTI structure is disposed within a recessed top surface of the vertical portion of the doped isolation layer.

19. The CMOS image sensor of claim 13, wherein the vertical portion extends between the adjacent pixel regions from the front-side of the substrate to a position within the substrate deeper than that of the lateral portion.

20. A method of forming an image sensor, comprising:
  forming doping layers corresponding to photodiodes of a plurality of pixel regions from a front-side of a substrate;
  forming a doped isolation layer from the front-side of the substrate by implanting a dopant species into the substrate through a plurality of implanting processes, the doped isolation layer comprising a vertical portion between adjacent pixel regions;
  forming a shallow trench isolation (STI) structure between the adjacent pixel regions from the front-side of the substrate to a position within the substrate;
  rotating the substrate and etching from a back-side of the substrate to form a deep trench between adjacent pixel regions and extending into the substrate, wherein the back-side of the substrate opposes the front-side of the substrate; and
  filling the deep trench with a doped layer and a dielectric fill layer a dielectric layer to form a back-side deep trench isolation (BDTI) structure that are disposed between the adjacent pixel regions and separate photodiodes of the adjacent pixel regions;
  wherein the doped isolation layer separates the STI structure from the BDTI structure.

* * * * *